(12) United States Patent
Yamasaki et al.

(10) Patent No.: US 11,257,735 B2
(45) Date of Patent: Feb. 22, 2022

(54) HEAT SINK-EQUIPPED POWER MODULE SUBSTRATE AND MANUFACTURING METHOD FOR HEAT SINK-EQUIPPED POWER MODULE SUBSTRATE

(71) Applicant: MITSUBISHI MATERIALS CORPORATION, Tokyo (JP)

(72) Inventors: Kazuhiko Yamasaki, Amagasaki (JP); Kotaro Masuyama, Ushiku (JP); Tatsuya Numa, Kobe (JP); Masayuki Ishikawa, Sanda (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 16/759,777

(22) PCT Filed: Nov. 5, 2018

(86) PCT No.: PCT/JP2018/040994
§ 371 (c)(1),
(2) Date: Apr. 28, 2020

(87) PCT Pub. No.: WO2019/088285
PCT Pub. Date: May 9, 2019

(65) Prior Publication Data
US 2020/0335416 A1    Oct. 22, 2020

(30) Foreign Application Priority Data

Nov. 6, 2017    (JP) .............................. JP2017-213917

(51) Int. Cl.
*H01L 23/373* (2006.01)
*H01L 21/48* (2006.01)
(Continued)

(52) U.S. Cl.
CPC ...... *H01L 23/3735* (2013.01); *H01L 21/4882* (2013.01); *H01L 23/46* (2013.01);
(Continued)

(58) Field of Classification Search
CPC . H01L 2224/03; H01L 2224/92; H01L 21/78; H01L 2224/27; H01L 2224/27505;
(Continued)

(56) References Cited

U.S. PATENT DOCUMENTS 9,355,986 B2 * 5/2016 Nishimoto ......... B23K 35/3602
2003/0102356 A1   6/2003 Schwarzbauer
(Continued)

FOREIGN PATENT DOCUMENTS

DE    102014013036 A1    3/2016
EP    2940727 A1    11/2015
(Continued)

OTHER PUBLICATIONS

International Search Report dated Dec. 25, 2018, issued for PCT/JP2018/040994 and English translation thereof.
(Continued)

*Primary Examiner* — Adam B Dravininkas
(74) *Attorney, Agent, or Firm* — Locke Lord LLP; James E. Armstrong, IV; Nicholas J. DiCeglie, Jr.

(57) ABSTRACT

The invention provides a power module substrate with a heat sink, which includes a power module substrate provided with an insulating substrate, a circuit layer provided on one surface of the insulating substrate and a metal layer provided on the other surface of the insulating substrate. The heat sink is bonded to the power module substrate via a bonding layer (30) to a surface on an opposite side to the insulating substrate of the metal layer. Bonding layer is a sintered body of silver particles, a porous body having a relative density in
(Continued)

a range of 60% or more and 90% or less, and having a thickness in a range of 10 μm or more and 500 μm or less.

4 Claims, 2 Drawing Sheets

(51) Int. Cl.
*H01L 23/46* (2006.01)
*H05K 1/02* (2006.01)
*H05K 3/46* (2006.01)
*H05K 7/20* (2006.01)

(52) U.S. Cl.
CPC ......... *H05K 1/0204* (2013.01); *H05K 3/4644* (2013.01); *H05K 7/209* (2013.01); *H05K 2201/066* (2013.01)

(58) Field of Classification Search
CPC ... H01L 2224/03505; H01L 2224/8384; H01L 2924/01047; H01L 23/3735; H01L 21/4882; H01L 23/46; H01L 2224/32225; H01L 23/12; H01L 23/36; H01L 23/373; H05K 1/0204; H05K 3/4644; H05K 7/209; H05K 2201/066
See application file for complete search history.

(56) References Cited

U.S. PATENT DOCUMENTS

| | | | |
|---|---|---|---|
| 2010/0187678 A1 | 7/2010 | Kajiwara et al. | |
| 2010/0323198 A1* | 12/2010 | Kuwajima | H01B 1/026 428/402 |
| 2011/0290863 A1 | 12/2011 | Kajiwara et al. | |
| 2012/0298408 A1* | 11/2012 | Nagatomo | H01L 23/142 174/260 |
| 2013/0049204 A1* | 2/2013 | Oeschler | H01L 23/04 257/772 |
| 2013/0335921 A1* | 12/2013 | Nagatomo | H05K 7/2039 361/709 |
| 2014/0138710 A1* | 5/2014 | Ohtsu | H01L 24/89 257/77 |
| 2015/0035137 A1* | 2/2015 | Nishimoto | B23K 1/203 257/712 |
| 2015/0255419 A1* | 9/2015 | Nishimoto | H01L 24/32 257/773 |
| 2016/0219693 A1* | 7/2016 | Nishimoto | H05K 3/465 |
| 2017/0144221 A1 | 5/2017 | Ghoshal et al. | |

FOREIGN PATENT DOCUMENTS

| | | |
|---|---|---|
| JP | 08-335652 A | 12/1996 |
| JP | 09-162336 A | 6/1997 |
| JP | 2008-198706 A | 8/2008 |
| JP | 2013-125779 A | 6/2013 |
| JP | 2013-182901 A | 9/2013 |
| JP | 2014-222788 A | 11/2014 |
| JP | 2015-115521 A | 6/2015 |
| JP | 2017-084921 A | 5/2017 |
| WO | 01/75963 A1 | 10/2001 |
| WO | 2014/034306 A1 | 3/2014 |
| WO | 2015/029511 A1 | 3/2015 |

OTHER PUBLICATIONS

Search Report issued in European Patent Application No. EP 18873260.6, dated Jun. 30, 2021.

* cited by examiner

HEAT SINK-EQUIPPED POWER MODULE SUBSTRATE AND MANUFACTURING METHOD FOR HEAT SINK-EQUIPPED POWER MODULE SUBSTRATE

TECHNICAL FIELD

The present invention relates to a power module substrate with a heat sink and a method for manufacturing a power module substrate with a heat sink.

Priority is claimed on Japanese Patent Application No. 2017-213917, filed Nov. 6, 2017, the content of which is incorporated herein by reference.

BACKGROUND ART

Power semiconductor elements used in inverters and the like generate a large amount of heat when operated. For this reason, as a substrate on which a power semiconductor element is mounted, it is possible to use a power module substrate which is provided with an insulating substrate formed of a highly heat-resistant ceramic, a circuit layer provided on one surface of the insulating substrate, and a metal layer provided on another surface of the insulating substrate.

In this power module substrate, a power semiconductor element is mounted on the circuit layer, a heat sink is brought into contact with the metal layer via a heat conductive material, and heat generated in the power semiconductor element is dissipated by the heat sink.

Grease with high thermal conductivity is widely used as a heat conductive material. In a case where the power module substrate and the heat sink are brought into contact with each other via the grease, if warping is generated in the power module substrate due to a thermal cycle caused by turning the power semiconductor element ON/OFF or the like, there is a concern that gaps may occur between the power module substrate and the grease and that the thermal conductivity between the power module substrate and the heat sink may be decreased.

For this reason, direct bonding of the metal layer of the power module substrate and the heat sink using a solder material is being studied. Patent Literature 1 describes a power module substrate with a heat sink in which a power module substrate and a heat sink are bonded using various types of solder materials such as Sn—Ag-based, Sn—In-based, or Sn—Ag—Cu-based solder materials.

CITATION LIST

Patent Literature

Patent Literature 1

Japanese Unexamined Patent Application, First Publication No. 2014-222788 (A)

SUMMARY OF INVENTION

Technical Problem

When the power module substrate with a heat sink of the related art, in which a power module substrate and a heat sink are bonded using a solder material, is subjected to a thermal cycle over a long period of time, the solder material is damaged through internal stress generated by a difference in linear expansion coefficient between the power module substrate and the heat sink, such that the thermal conductivity between the power module substrate and the solder material may be partially decreased. When this partial decrease in thermal conductivity occurs, the thermal resistance between the power module substrate and the heat sink increases, heat is easily accumulated in the power module substrate, the temperature of the semiconductor element increases and there is a possibility that the power module substrate may be damaged and breaking may be generated in the insulating substrate.

The present invention was made in view of the circumstances described above and has an object of providing a power module substrate with a heat sink capable of suppressing, over a long period of time, an increase in thermal resistance and the generation of breaking in an insulating substrate due to a thermal cycle load, and a method for manufacturing a power module substrate with a heat sink.

Solution to Problem

In order to solve the above problems, a power module substrate with a heat sink of the present invention includes a power module substrate provided with an insulating substrate, a circuit layer provided on one surface of the insulating substrate, and a metal layer provided on the other surface of the insulating substrate; and a heat sink bonded via a bonding layer to a surface of the metal layer of the power module substrate on an opposite side to the insulating substrate, in which the bonding layer is a sintered body of silver particles and a porous body having a relative density in a range of 60% or more and 90% or less and has a thickness in a range of 10 μm or more and 500 μm or less.

According to the power module substrate with a heat sink of the present invention having such a configuration, since the bonding layer is formed of a sintered body of silver particles, the bonding layer has a high melting point and is not easily melted. In addition, since the sintered body of silver particles forming the bonding layer is a porous body having a relative density in a range of 60% or more and 90% or less and has a thickness in a range of 10 μm or more and 500 μm or less, internal stress caused by a difference in linear expansion coefficient between the power module substrate and the heat sink during loading of a thermal cycle is alleviated and the bonding layer is not easily damaged. Thus, it is possible for the power module substrate with a heat sink of the present invention to suppress, over a long period of time, an increase in thermal resistance and the generation of breaking in the insulating substrate due to the thermal cycle load.

Here, in the power module substrate with a heat sink of the present invention, the metal layer is preferably formed of an aluminum sheet formed of aluminum or an aluminum alloy, or a copper sheet formed of copper or a copper alloy.

In such a case, since the metal layer is formed of an aluminum sheet formed of aluminum or an aluminum alloy, or a copper sheet formed of copper or a copper alloy, the heat conductivity is high and it is possible to efficiently transmit heat generated in the semiconductor element mounted on the circuit layer to the heat sink.

In addition, in the power module substrate with a heat sink of the present invention, in a case where the metal layer is formed of the aluminum sheet, a silver plating layer or a gold plating layer is preferably provided on a surface of the aluminum sheet on an opposite side to the insulating substrate.

In such a case, since a silver plating layer or a gold plating layer is provided on the surface of the aluminum sheet (metal layer) on an opposite side to the insulating substrate, the bonding force between the metal layer and the bonding layer (sintered body of silver particles) is high.

A method for manufacturing a power module substrate with a heat sink of the present invention is a method for manufacturing the power module substrate with a heat sink described above including a process of forming paste-bonding material composition layer of providing a layer of a paste-bonding material composition including silver particles having an average particle size in a range of 0.1 μm or more and 1 μm or less in an amount in a range of 70% by mass or more and 95% by mass or less on at least one surface of a surface of a metal layer of a power module substrate on an opposite side to an insulating substrate and a heat sink, the power module substrate being provided with the insulating substrate, a circuit layer provided on one surface of the insulating substrate, and the metal layer provided on the other surface of the insulating substrate; a laminating process of laminating the power module substrate and the heat sink via the layer of the paste-bonding material composition; and a heating process of heating the laminated power module substrate and the heat sink at a temperature of 150° C. or higher and 300° C. or lower under a pressure of 1 MPa or less in a laminating direction.

According to the method for manufacturing a power module substrate with a heat sink of the present invention having such a configuration, since a laminate, in which the power module substrate and the heat sink are laminated via a layer of a paste-bonding material composition including silver particles having an average particle size in a range of 0.1 μm or more and 1 μm or less in an amount in a range of 70 by mass or more and 95% by mass or less, is heated at a temperature of 150° C. or higher and 300° C. or lower under a pressure of 1 MPa or less in the laminating direction, it is possible to reliably sinter the silver particles without causing an excessive increase in density. Due to this, between the metal layer of the power module substrate and the heat sink, it is possible to produce a bonding layer which is a sintered body of silver particles and a porous body having a relative density in a range of 60% or more and 90% or less.

Advantageous Effects of Invention

According to the present invention, it is possible to provide a power module substrate with a heat sink which is able to suppress, over a long period of time, an increase in thermal resistance and the generation of breaking in the insulating substrate due to a thermal cycle load and a method for manufacturing the power module substrate with a heat sink.

DESCRIPTION OF EMBODIMENTS

A description will be given below of embodiments of the present invention with reference to the accompanying drawings.

Figure 1:
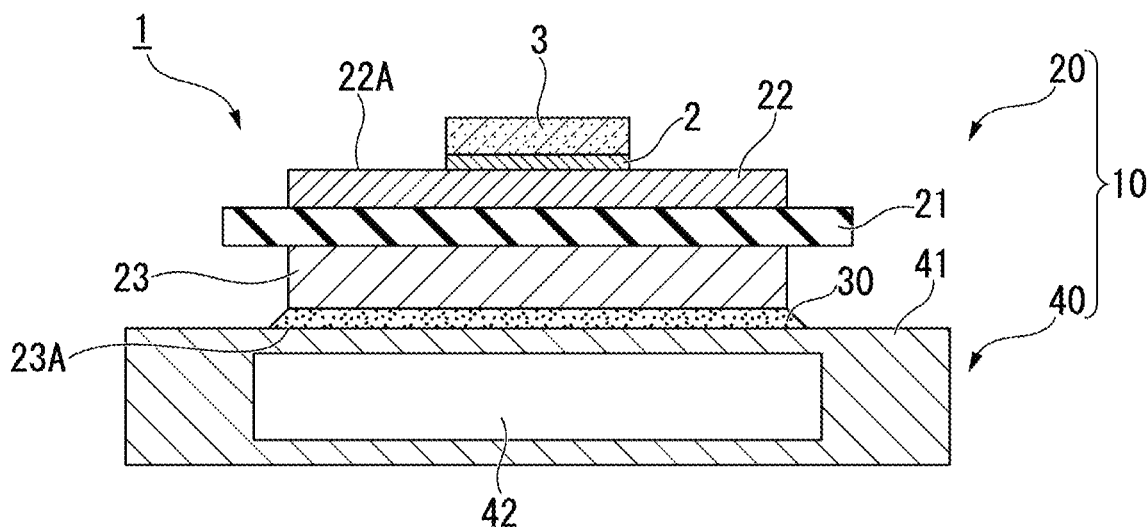
FIG. 1 is a schematic explanatory view of a power module using a power module substrate with a heat sink according to an embodiment of the present invention.

FIG. 1 is a schematic explanatory view of a power module using a power module substrate with a heat sink according to an embodiment of the present invention.

In FIG. 1, a power module 1 is provided with a power module substrate with a heat sink 10, and a semiconductor element 3 bonded to a surface on one side (the upper side in FIG. 1) of the power module substrate with a heat sink 10 via a solder layer 2. Here, the solder layer 2 is, for example, a Sn—Ag-based, Sn—In-based, or Sn—Ag—Cu-based solder material (so-called lead-free solder material).

The power module substrate with a heat sink 10 is provided with a power module substrate 20 and a heat sink 40 bonded thereto via the bonding layer 30.

The power module substrate 20 has an insulating substrate 21, a circuit layer 22 provided on one surface of the insulating substrate 21, and a metal layer 23 provided on the other surface of the insulating substrate 21.

The insulating substrate 21 prevents electrical connection between the circuit layer 22 and the metal layer 23 and is formed of a ceramic which has a high insulating property such as AlN (aluminum nitride), $Si_3N_4$ (silicon nitride), and $Al_2O_3$ (alumina). In addition, the thickness of the insulating substrate 21 is set in a range of 0.2 mm or more and 1.5 mm or less and is set to 0.635 mm in the present embodiment.

The circuit layer 22 is formed by bonding an aluminum sheet formed of aluminum or an aluminum alloy or a copper sheet formed of copper or a copper alloy to one surface (an upper surface in FIG. 1) of the insulating substrate 21. As the aluminum sheet, it is possible to use aluminum having a purity of 99% by mass or more (A1050, A1080, and the like) and high-purity aluminum (4N—Al) having a purity of 99.99% by mass or more. As the copper sheet, it is possible to use oxygen-free copper and high-purity copper (6N—Cu) having a purity of 99.9999% by mass or more. The thickness of the circuit layer 22 is set in a range of 0.1 mm or more and 1.0 mm or less and is set to 0.3 mm in the present embodiment. In addition, a circuit pattern is provided on the circuit layer 22 and one surface (the upper surface in FIG. 1) is a mounting surface 22A on which the semiconductor element 3 is mounted. In the present embodiment, a nickel plating layer (not shown) may be provided between the mounting surface 22A of the circuit layer 22 and the solder layer 2.

The metal layer 23 is formed by bonding an aluminum sheet formed of aluminum or an aluminum alloy or a copper sheet formed of copper or a copper alloy to the other surface (a lower surface in FIG. 1) of the insulating substrate 21. As the aluminum sheet, it is possible to use aluminum having a purity of 99% by mass or more (A1050, A1080, and the like) and high-purity aluminum (4N—Al) having a purity of 99.99% by mass or more. As the copper sheet, it is possible to use oxygen-free copper and high-purity copper (6N—Cu) having a purity of 99.9999% by mass or more. The thickness of the metal layer 23 is set in a range of 0.1 mm or more and 1.0 mm or less and is set to 0.3 mm in the present embodiment.

In the present embodiment, the surface of the metal layer 23 on an opposite side to the insulating substrate 21 is set as a bonding surface 23A to which the heat sink 40 is bonded via the bonding layer 30. In a case where the metal layer 23 is formed of an aluminum sheet, a silver plating layer or a gold plating layer (not shown) is preferably provided on the bonding surface 23A. Providing the silver plating layer or the gold plating layer increases the bonding force between the metal layer 23 and the bonding layer 30 and makes it possible to further improve the reliability of the power module substrate with a heat sink. The thicknesses of the silver plating layer and the gold plating layer are preferably in a range of 0.05 µm to 1 µm. Here, even in a case where the metal layer 23 is formed of a copper sheet, a silver plating layer or a gold plating layer may be provided on the bonding surface 23A.

The heat sink 40 is for cooling the power module substrate 20 described above. One surface (the upper surface in FIG. 1) of the heat sink 40 is a top plate part 41 bonded to the metal layer 23 of the power module substrate 20 via the bonding layer 30. Inside the heat sink 40, a passage 42 through which a cooling medium flows is provided. Instead of providing the passage 42, a surface of the heat sink 40 other than the top plate part 41 may have a fin structure.

The heat sink 40 is formed of aluminum, an aluminum alloy, copper, or a copper alloy. In the present embodiment, the heat sink 40 is formed of an aluminum alloy. As the aluminum alloy, it is possible to use an A3003 alloy, an A1100 alloy, an A3003 alloy, an A5052 alloy, an A7N01 alloy, and an A6063 alloy. The surface of the top plate part 41 of the heat sink 40 may be provided with a silver plating layer or a gold plating layer (not shown). Providing the silver plating layer or the gold plating layer increases the bonding force between the heat sink 40 and the bonding layer 30 and makes it possible to further improve the reliability of the power module substrate with a heat sink.

The bonding layer 30 is formed of a sintered body of silver particles. Although fine silver particles are sintered at a relatively low temperature, the sintered body of the silver particles has improved thermal stability and is not melted by heat generated in a normal power semiconductor element. In addition, the sintered body of silver particles forming the bonding layer 30 is a porous body having a large number of pores and has a relative density in a range of 60% or more and 90% or less, preferably 62% or more and 90% or less, and more preferably in a range of 80% or more and 88% or less. Due to the pores in the bonding layer 30, the bonding layer 30 has a lower elastic modulus than bulk silver, and, internal stress caused by a difference in linear expansion coefficient between the power module substrate 20 and the heat sink 40 during loading of a thermal cycle is alleviated. For this reason, the bonding layer 30 is not easily damaged during loading of a thermal cycle. When the relative density is less than 60%, the mechanical strength of the bonding layer 30 which is a sintered body is reduced and there is a concern that the bonding layer 30 may be damaged during loading of a thermal cycle. On the other hand, when the relative density exceeds 90%, the elastic modulus of the bonding layer 30 becomes substantially the same as that of bulk silver and there is a concern that the function of alleviating internal stress by the bonding layer 30 during loading of a thermal cycle may be reduced. The relative density of the bonding layer 30 is the percentage of the density (actual measured value) of the bonding layer 30 with respect to the true density of silver.

The thickness of the bonding layer 30 is in a range of 10 µm or more and 500 µm or less. When the thickness of the bonding layer 30 is less than 10 µm, the ability to alleviate internal stress in the bonding layer 30 during loading of a thermal cycle is reduced and there is a concern that the bonding layer 30 may be damaged. On the other hand, when the thickness of the bonding layer 30 exceeds 500 µm, the mechanical strength of the bonding layer 30 decreases and there is a concern that the bonding layer 30 may be damaged during loading of a thermal cycle.

The preferable thickness of the bonding layer 30 is in a range of 10 µm or more and 100 µm or less and more preferably in a range of 15 µm or more and 50 µm or less.

Next, a description will be given of a method for manufacturing a power module substrate with a heat sink according to the present embodiment with reference to FIG. 2.

Figure 2:
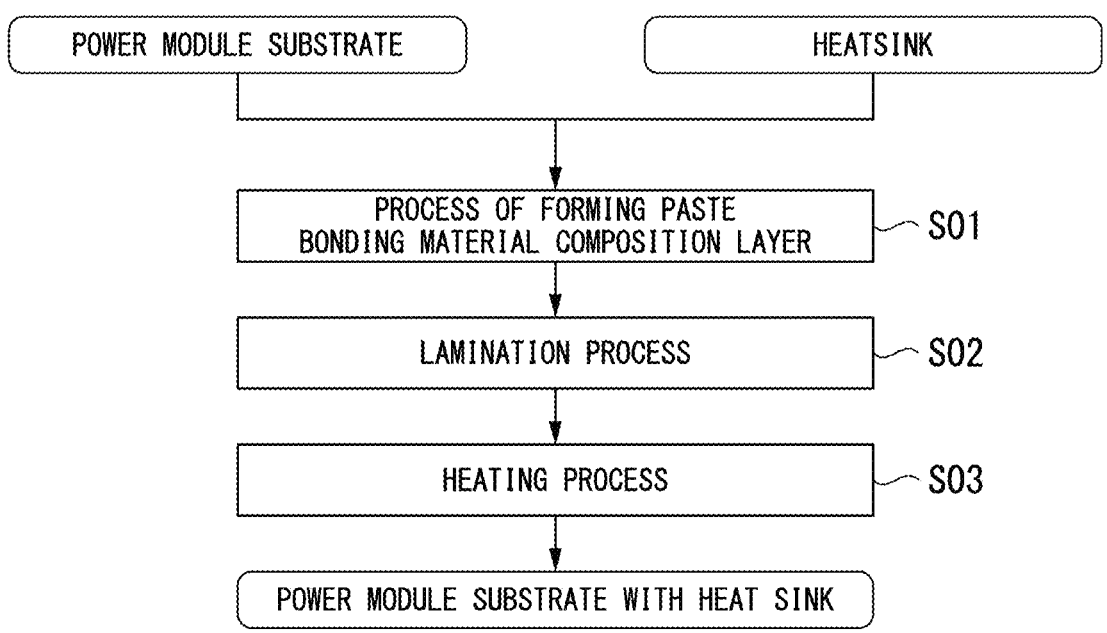
FIG. 2 is a flowchart of a method for manufacturing a power module substrate with a heat sink according to an embodiment of the present invention.

FIG. 2 is a flowchart of a method for manufacturing a power module substrate with a heat sink according to an embodiment of the present invention. The method for manufacturing a power module substrate with a heat sink according to an embodiment of the present invention is provided with a process of forming paste-bonding material composition layer S01, a laminating process S02, and a heating process S03.

(Process of Forming Paste-Bonding Material Composition Layer S01)

In the process of forming paste-bonding material composition layer S01, a layer of the paste-bonding material composition is provided on the surface of at least one of the surface of the metal layer of the power module substrate on an opposite side to the insulating substrate and the heat sink. As a method for providing the layer of the paste-bonding material composition, it is possible to use a method such as a coating method or a dipping method. In a heating process S03 described below, the bonding layer 30 is generated by heating the paste-bonding material composition layer.

The paste-bonding material composition includes a solvent and silver particles.

The solvent of the paste-bonding material composition is not particularly limited as long as removal is possible by evaporation in the heating process S03 described below. As the solvent, for example, it is possible to use an alcohol-based solvent, a glycol-based solvent, an acetate-based solvent, a hydrocarbon-based solvent, and an amine-based solvent. Examples of alcohol-based solvents include α-terpineol and isopropyl alcohol. Examples of glycol-based solvents include ethylene glycol, diethylene glycol, and polyethylene glycol. Examples of acetate-based solvents include butyl carbitol acetate. Examples of hydrocarbon-based solvents include decane, dodecane, and tetradecane. Examples of amine-based solvents include hexylamine, octylamine, and dodecylamine. One of these solvents may be used alone or two kinds or more thereof may be used in combination.

As the silver particles, particles having an average particle size in the range of 0.1 µm or more and 1 µm or less are used. When the average particle size of the silver particles is less than 0.1 µm, it is difficult to increase the thickness of the paste-bonding material composition layer and, in the heating process S03 described below, the sintering of the silver particles proceeds easily and there is a concern that the relative density of the generated bonding layer 30 may be excessively high. On the other hand, when the average particle size of the silver particles exceeds 1 µm, in the heating process S03 described below, the sintering of the silver particles does not proceed easily and there is a concern that the relative density of the generated bonding layer 30 may be excessively low. The preferable range of the average particle size of the silver particles is 0.2 µm or more and 0.5 µm or less.

Silver particles may be coated with a protective material for preventing oxidation and agglomeration. As the protective material, it is possible to use an organic substance having 2 to 8 carbon atoms. The organic substance is preferably a carboxylic acid. Examples of carboxylic acids include glycolic acid, citric acid, malic acid, maleic acid, malonic acid, fumaric acid, succinic acid, and tartaric acid. The content of the protective material is preferably 1% by mass or less when the silver particles are 100% by mass.

The content of the silver particles in the paste-bonding material composition is an amount in a range of 70% by mass or more and 95% by mass or less when the paste-bonding material composition is 100% by mass. When the content is less than 70% by mass, the viscosity of the paste-bonding material composition is excessively low, such that it is difficult to increase the thickness of the paste-bonding material composition layer and, in the heating process S03 described below, the sintering of the silver particles does not proceed easily and there is a concern that the relative density of the generated bonding layer 30 may be excessively low. On the other hand, when the content of the silver particles exceeds 95% by mass, the viscosity of the paste-bonding material composition is excessively high and there is a concern that it may be difficult to provide a paste-bonding material composition layer. The content of the silver particles in the paste-bonding material composition is preferably an amount in a range of 70% by mass or more and 90% by mass or less, and more preferably an amount in a range of 85% by mass or more and 90% by mass or less.

It is not possible to uniformly determine the thickness of the paste-bonding material composition layer since the thickness differs depending on the average particle size and content of the silver particles of the paste-bonding material composition; however, it is sufficient if the thickness of the bonding layer generated by heating in the heating process S03 described below is in a range of 10 μm or more and 500 μm or less. The preferable thickness of the bonding layer is in a range of 10 μm or more and 100 μm or less.

(Laminating Process S02)

In the laminating process S02, the power module substrate and the heat sink are laminated via the paste-bonding material composition layer provided in the process of forming paste-bonding material composition layer S01. The thickness of the paste-bonding material composition layer interposed between the laminated power module substrate and the heat sink is preferably uniform.

(Heating Process S03)

In the heating process S03, a laminate of the power module substrate and the heat sink laminated in the laminating process S02 is heated.

The heating temperature of the laminate is 150° C. or higher and 300° C. or lower, and preferably 170° C. or higher and 270° C. or lower. When the heating temperature is lower than 150° C., the silver particles of the paste-bonding material composition layer are difficult to sinter and there is a concern that it may not be possible to provide the bonding layer. On the other hand, when the heating temperature exceeds 300° C., sintering of the silver particles of the paste-bonding material composition layer proceeds excessively and there is a concern that the relative density of the generated bonding layer may be excessively high.

Heating of the laminate is performed under a pressure of 1 MPa or less in the laminating direction. The laminate may not be pressed in the laminating direction. When the laminate is heated in a state where the pressure is applied at a pressure exceeding 1 MPa in the laminating direction, the sintering of the silver particles proceeds excessively and there is a concern that the relative density of the generated bonding layer may be excessively high.

By heating the laminate in this manner, the silver particles in the paste-bonding material composition layer are sintered to manufacture the power module substrate with a heat sink according to the present embodiment.

According to the power module substrate with a heat sink 10 according to the present embodiment having the configuration described above, since the metal layer 23 of the power module substrate 20 is formed of an aluminum sheet formed of aluminum or an aluminum alloy, it is possible to efficiently transmit the heat generated in the semiconductor element 3 mounted on the circuit layer 22 to the heat sink 40. In addition, since the bonding layer 30 is formed of a sintered body of silver particles, the bonding layer 30 has a high melting point and is not easily melted. Furthermore, the sintered body of silver particles forming the bonding layer 30 is a porous body having a relative density in a range of 60% or more and 90% or less and has a thickness in a range of 10 μm or more and 500 μm or less, thus, internal stress caused by the difference in the linear expansion coefficient between the power module substrate 20 and the heat sink 40 during loading of the thermal cycle is alleviated and the bonding layer 30 is not easily damaged. Thus, it is possible for the power module substrate with a heat sink 10 according to the present embodiment to suppress, over a long period of time, an increase in thermal resistance and the generation of breaking in the insulating substrate 21 due to a thermal cycle load.

In addition, according to the method for manufacturing the power module substrate with a heat sink 10 according to the present embodiment, since a laminate, in which the power module substrate 20 and the heat sink 40 are laminated via a layer of a paste-bonding material composition including silver particles having an average particle size in a range of 0.1 μm or more and 1 μm or less in a range of 70% by mass or more and 95% by mass or less, is heated at a temperature of 150° C. or higher and 300° C. or lower under a pressure of 1 MPa or less in the laminating direction, it is possible to reliably sinter the silver particles without causing an excessive increase in density. Due to this, between the metal layer 23 of the power module substrate 20 and the heat sink 40, it is possible to generate a bonding layer 30 which is a sintered body of silver particles and a porous body having a relative density in a range of 60% or more and 90% or less.

Although the embodiments of the present invention were described above, the present invention is not limited thereto and is able to be appropriately changed without departing from the technical idea of the present invention.

For example, in the power module substrate with a heat sink 10 of the present embodiment, the semiconductor element 3 is mounted on the circuit layer 22, but the present invention is not limited thereto, for example, electronic components other than the semiconductor element such as an LED may be mounted thereon.

EXAMPLES

A description will be given of the results of confirmation experiments performed to confirm the effectiveness of the present invention.

Example 1

(1) Manufacturing of Power Module Substrate

A circuit layer and a metal layer were bonded to an insulating substrate to manufacture a power module substrate. The material of the insulating substrate was aluminum nitride (AlN). The material of the circuit layer was oxygen-free copper. The material of the metal layer was A1050. The size of the insulating substrate was 40 mm×40 mm, the size of the circuit layer was 37 mm×37 mm, and the size of the metal layer was 37 mm×37 mm.

The insulating substrate and the circuit layer were bonded by heating at 850° C. for 10 minutes in a vacuum of $10^{-3}$ Pa using an active brazing material formed of Ag-27.4 mass % Cu-2.0 mass % Ti.

The insulating substrate and the metal layer were bonded by heating at 650° C. for 30 minutes in a vacuum of $10^{-3}$ Pa in a state of being pressed in the laminating direction at 12 kgf/cm² (1.2 MPa) using a brazing material foil (thickness: 100 μm) formed of Al-7.5 mass % Si.

(2) Preparation of Paste-Bonding Material Composition

Ethylene glycol (EG) and silver powder having an average particle size of 0.5 μm were prepared. 15 parts by mass of EG and 85 parts by mass of silver powder were kneaded using a kneader to prepare a paste-bonding material composition. The kneading by the kneader was performed three times at a rotation speed of 2000 rpm for 5 minutes.

(3) Power Module Substrate with Heat Sink

As a heat sink, a 50 mm×60 mm aluminum sheet formed of an A3003 alloy with a thickness of 5 mm and having a cooling medium passage therein was prepared.

First, silver plating was applied to each of the bonding surface of the metal layer of the power module substrate manufactured in (1) described above and the top plate part of the prepared heat sink to provide a silver plating layer such that the thickness was 0.1 μm to 0.5 μm. Next, the paste-bonding material composition prepared in (2) was coated on the surface of the silver plating layer of the heat sink to provide a paste-bonding material composition layer. The thickness of the paste-bonding material composition layer was set such that the thickness of the bonding layer generated by heating was 100 μm. Next, the silver plating layer of the metal layer of the power module substrate was mounted on the paste-bonding material composition layer of the heat sink and the power module substrate and the heat sink were laminated. Then, the laminate of the power module substrate and the heat sink was placed into a heater and heated in an air atmosphere at a heating temperature of 250° C. for 60 minutes under bonding conditions in which pressing in the laminating direction is not performed to manufacture a power module substrate with a heat sink.

Examples 2 to 9 and Comparative Examples 1 to 11

A power module substrate with a heat sink was manufactured in the same manner as in Example 1, except that the material of the circuit layer and the metal layer of the power module substrate and the type of the plating layer, the type of the bonding material of the paste-bonding material composition, the blending amount of the solvent and the bonding material, and the type of the plating layer of the heat sink were changed as shown in Table 1 below and the bonding conditions when bonding the power module substrate and the heat sink and the thickness of the bonding layer were changed as shown in Table 2 below. The SAC solder used as the bonding material of the paste-bonding material composition of Comparative Example 11 was a Sn—Ag—Cu-based solder material.

[Evaluation]

For the substrates for a power module with a heat sink manufactured in Examples 1 to 9 and Comparative Examples 1 to 11, the thickness of the bonding layer and relative density were measured by the following methods and, in addition, a thermal cycle test was performed by the following method on the substrates for a power module with a heat sink and breaking in the substrate after the thermal cycle and the thermal resistance change rate before and after the thermal cycle were measured. The results are shown in Table 2.

(Thickness of Bonding Layer)

The thickness of the power module substrate and the heat sink was measured in advance using a micrometer (precision length measuring instrument) and the total thickness of the power module substrate with a heat sink after bonding was measured. The value obtained by subtracting the thickness of the power module substrate and the heat sink measured in advance from the total thickness of the power module substrate with a heat sink was set as the thickness of the bonding layer.

(Relative Density of Bonding Layer)

The bonding layer was collected from the power module substrate with a heat sink. The size of the collected bonding layer was measured and the volume of the collected bonding layer was determined from the measured size and the thickness of the bonding layer measured by the above method. Next, the collected bonding layer was dissolved using nitric acid. The mass of silver contained in the collected bonding layer was determined from the volume of the obtained solution and the silver concentration.

Then, the relative density of the collected bonding layer was calculated from the following equation using the volume of the bonding layer and the mass of silver.

$$\text{Relative density of bonding layer (\%)} = \{(\text{mass of silver/volume of bonding layer})/\text{true density of silver}\} \times 100$$

(Thermal Cycle Test)

The thermal cycle test was performed under the following conditions. The presence or absence of breaking in the insulating substrate after 3000 cycles was evaluated. The results are shown in Table 2.

Evaluation device: TSB-51 manufactured by Espec Corporation

Liquid phase: Fluorinert

Temperature condition: −40° C.×5 min ↔ 125° C.×5 min (Measurement of Thermal Resistance)

A heater chip was attached to the circuit layer of the power module substrate with a heat sink and a cooling medium [ethylene glycol:water=9:1 (mass ratio)] was passed through the passage of the heat sink Next, the heater chip was heated with an electrical power of 100 W. The temperature of the heater chip and the temperature of the cooling medium flowing through the heat sink were measured using a thermocouple. A value obtained by dividing the difference between the temperature of the heater chip and the temperature of the cooling medium by the electrical power was set as the thermal resistance. Before and after the thermal cycle test, a sample having a thermal resistance change rate of 5% or less was determined as "A" and a sample having a rate of change exceeding 5% was determined as "B". Table 2 shows the results of the determination. The measurement conditions are shown below.

Temperature difference: 80° C.

Temperature range: 55° C. to 135° C. (measured with the temperature sense diode in the IGBT element)

Energization time: 6 seconds

Cooling time: 4 seconds (Structure of Bonding Layer)

The power module substrate with a heat sink was cut along the laminating direction and the cut surface of the bonding layer was observed using an SEM (electron scanning microscope).

Figure 3:
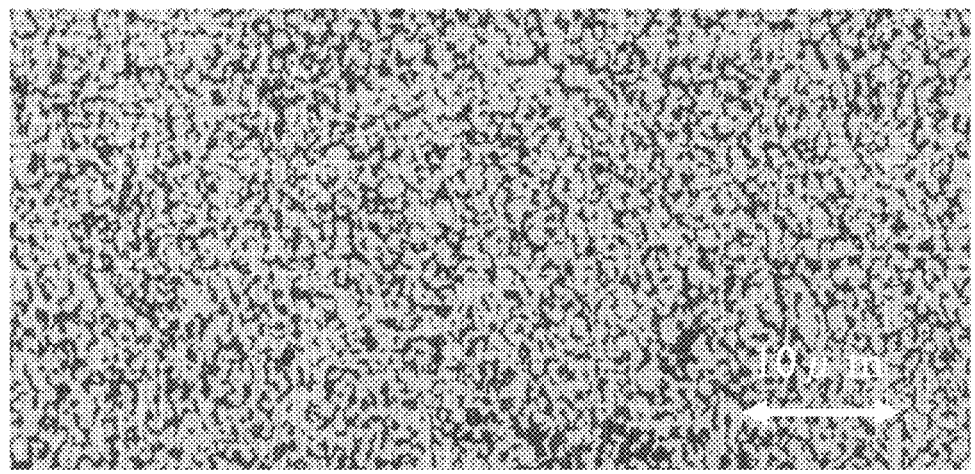
FIG. 3 is a cross-sectional SEM photograph of a bonding layer of a power module substrate with a heat sink manufactured in Example 9 of the present invention.

FIG. 3 shows an SEM photograph of a cross-section of the bonding layer of the power module substrate with a heat sink manufactured in Example 9. From the SEM photograph of FIG. 3, it was confirmed that the bonding layer was a sintered body of silver particles and a porous body having many pores. Here, it was confirmed that the bonding layer of the power module substrate with a heat sink manufactured in Examples 1 to 8 was also a sintered body of silver particles and a porous body having many pores.

TABLE 1

| | Power module substrate | | | | Paste-bonding material composition | | | | Heat sink | |
| | | | | | Solvent | | Bonding material | | | |
| | Insulating substrate Material | Circuit layer Material | Metal layer | | | Blending amount | | Average particle | Blending amount | | |
| | | | Material | Plating layer | Material | (parts by mass) | Type | size (μm) | (parts by mass) | Material | Plating layer |
|---|---|---|---|---|---|---|---|---|---|---|---|
| Example 1 | Aluminum nitride | Oxygen-free copper | A1050 | Silver plating | EG | 15 | Silver | 0.5 | 85 | A3003 | Silver plating |
| Example 2 | Aluminum nitride | Oxygen-free copper | A1050 | Gold plating | EG | 15 | Silver | 0.5 | 85 | A3003 | Gold plating |
| Example 3 | Aluminum nitride | Oxygen-free copper | A1050 | Silver plating | EG | 15 | Silver | 0.5 | 85 | A3003 | Silver plating |
| Example 4 | Aluminum nitride | Oxygen-free copper | A1050 | Silver plating | EG | 15 | Silver | 0.5 | 85 | A3003 | Silver plating |
| Example 5 | Aluminum nitride | Oxygen-free copper | A1050 | Silver plating | EG | 15 | Silver | 0.5 | 85 | A3003 | Silver plating |
| Example 6 | Aluminum nitride | Oxygen-free copper | A1050 | Silver plating | EG | 15 | Silver | 0.2 | 85 | A3003 | Silver plating |
| Example 7 | Aluminum nitride | 6N—Cu | A1050 | Silver plating | EG | 15 | Silver | 1.0 | 85 | A3003 | Silver plating |
| Example 8 | Aluminum nitride | 4N—Al | A1080 | Silver plating | EG | 30 | Silver | 0.5 | 70 | A3003 | Silver plating |
| Example 9 | Aluminum nitride | Oxygen-free copper | 4N—Al | Silver plating | EG | 5 | Silver | 0.5 | 95 | A3003 | Silver plating |
| Comparative Example 1 | Aluminum nitride | Oxygen-free copper | A1050 | Silver plating | EG | 15 | Silver | 0.05 | 85 | A3003 | Silver plating |
| Comparative Example 2 | Aluminum nitride | Oxygen-free copper | A1050 | Silver plating | EG | 15 | Silver | 2.0 | 85 | A3003 | Silver plating |
| Comparative Example 3 | Aluminum nitride | Oxygen-free copper | A1050 | Silver plating | EG | 40 | Silver | 0.5 | 60 | A3003 | Silver plating |
| Comparative Example 4 | Aluminum nitride | Oxygen-free copper | A1050 | Silver plating | EG | 3 | Silver | 0.5 | 97 | A3003 | Silver plating |
| Comparative Example 5 | Aluminum nitride | Oxygen-free copper | A1050 | Silver plating | EG | 15 | Silver | 0.5 | 85 | A3003 | Silver plating |
| Comparative Example 6 | Aluminum nitride | Oxygen-free copper | A1050 | Silver plating | EG | 15 | Silver | 0.5 | 85 | A3003 | Silver plating |
| Comparative Example 7 | Aluminum nitride | Oxygen-free copper | A1050 | Silver plating | EG | 15 | Silver | 0.5 | 85 | A3003 | Silver plating |
| Comparative Example 8 | Aluminum nitride | Oxygen-free copper | A1050 | Silver plating | EG | 15 | Silver | 0.5 | 85 | A3003 | Silver plating |
| Comparative Example 9 | Aluminum nitride | Oxygen-free copper | A1050 | Silver plating | EG | 15 | Silver | 0.5 | 85 | A3003 | Silver plating |
| Comparative Example 10 | Aluminum nitride | Oxygen-free copper | A1050 | Silver plating | EG | 15 | Copper | 0.5 | 85 | A3003 | Silver plating |
| Comparative Example 11 | Aluminum nitride | Oxygen-free copper | A1050 | Silver plating | EG | 5 | SAC solder | 2 | 95 | A3003 | Silver plating |

TABLE 2

| | Bonding conditions | | Bonding layer | | Evaluation results | |
| | Heating temperature (° C.) | Pressure (MPa) | Thickness (μm) | Relative density (%) | Thermal resistance change rate | Breaking in substrate after thermal cycle |
|---|---|---|---|---|---|---|
| Example 1 | 250 | No pressure | 100 | 75 | A | Absent |
| Example 2 | 150 | No pressure | 100 | 60 | A | Absent |
| Example 3 | 300 | 1 | 100 | 90 | A | Absent |
| Example 4 | 250 | No pressure | 10 | 70 | A | Absent |
| Example 5 | 250 | No pressure | 500 | 75 | A | Absent |
| Example 6 | 250 | No pressure | 100 | 90 | A | Absent |

TABLE 2-continued

| | Bonding conditions | | Bonding layer | | Evaluation results | |
|---|---|---|---|---|---|---|
| | Heating temperature (° C.) | Pressure (MPa) | Thickness (μm) | Relative density (%) | Thermal resistance change rate | Breaking in substrate after thermal cycle |
| Example 7 | 250 | No pressure | 100 | 70 | A | Absent |
| Example 8 | 250 | No pressure | 100 | 75 | A | Absent |
| Example 9 | 250 | No pressure | 100 | 80 | A | Absent |
| Comparative Example 1 | 250 | No pressure | 10 | 95 | B | Present |
| Comparative Example 2 | 150 | No pressure | 100 | 50 | B | Present |
| Comparative Example 3 | 250 | No pressure | 15 | 50 | B | Present |
| Comparative Example 4 | Not possible to form paste-bonding material composition layer | | | | | |
| Comparative Example 5 | 130 | No pressure | Not possible to form bonding layer | | | |
| Comparative Example 6 | 350 | No pressure | 100 | 95 | B | Present |
| Comparative Example 7 | 300 | 3 | 100 | 95 | B | Present |
| Comparative Example 8 | 250 | No pressure | 5 | 75 | B | Present |
| Comparative Example 9 | 250 | No pressure | 600 | 75 | B | Present |
| Comparative Example 10 | 350 | No pressure | Not possible to form bonding layer | | | |
| Comparative Example 11 | 250 | No pressure | 100 | 85 | B | Present |

The power module substrate with a heat sink of Comparative Example 1 manufactured using the paste-bonding material composition having an average particle size of silver particles smaller than the range of the present invention had a relative density of the bonding layer which was higher than the range of the present invention. This is presumed to be due to the fact that the silver particles were fine such that the sintering of the silver particles proceeded easily. On the other hand, the power module substrate with a heat sink of Comparative Example 2 manufactured using a paste-bonding material composition having an average particle size of silver particles larger than the range of the present invention had a relative density of the bonding layer which was lower than the range of the present invention. This is presumed to be due to the fact that the gap between the silver particles became large.

The power module substrate with a heat sink of Comparative Example 3 manufactured using the paste-bonding material composition having a smaller content of silver particles than the range of the present invention had a relative density of the bonding layer which was lower than the range of the present invention. This is presumed to be due to the fact that the amount of the solvent was relatively large such that gaps were easily provided between the silver particles. On the other hand, in Comparative Example 4 using the paste-bonding material composition in which the content of silver particles was larger than the range of the present invention, it was not possible to provide the paste-bonding material composition layer on the top plate part of the heat sink. This is presumed to be due to the fact that the viscosity of the paste-bonding material composition was excessively high.

In Comparative Example 5, in which the heating temperature of the laminate was lower than the range of the present invention, it was not possible to provide a bonding layer. This is because the silver particles did not sinter. On the other hand, in the power module substrate with a heat sink of Comparative Example 6 manufactured under bonding conditions in which the heating temperature of the laminate was higher than the range of the present invention, the relative density of the bonding layer was higher than the range of the present invention. This is presumed to be due to the fact that the sintering of the silver particles proceeded excessively. Furthermore, in the power module substrate with a heat sink of Comparative Example 7 manufactured under the bonding condition of applying a pressure larger than the range of the present invention in the laminating direction, the relative density of the bonding layer was higher than the range of the present invention. This is presumed to be due to the fact that the sintering proceeded in a state where the silver particles were in strong contact with each other.

On the other hand, in Examples 1 to 9 in which the average particle size and the content of the silver particles of the paste-bonding material composition were in the range of the present invention and the heating temperature of the laminate and the pressure applied in the laminating direction were in the range of the present invention, in the obtained power module substrate with a heat sink, the relative density of the bonding layer was in the range of the present invention.

In Comparative Examples 1, 6, and 7 in which the relative density of the bonding layer was larger than the range of the present invention, the thermal resistance change rate was large and breaking occurred in the insulating substrate after the thermal cycle. This is presumed to be due to the fact that the elastic modulus of the bonding layer was almost the same as that of bulk silver, the function of alleviating the internal stress by the bonding layer was decreased, and the bonding layer was damaged during loading of the thermal cycle. On the other hand, Comparative Examples 2 and 3, in which the relative density of the bonding layer was lower than the range of the present invention, also had a large thermal resistance change rate and breaking occurred in the insulating substrate after the thermal cycle. This is presumed to be because the mechanical strength of the bonding layer was decreased and the bonding layer was damaged during loading of the thermal cycle.

In addition, Comparative Example 8, in which the thickness of the bonding layer was smaller than the range of the present invention, had a large rate of change in the thermal resistance and breaking occurred in the insulating substrate after the thermal cycle. This is presumed to be due to the fact that the function of alleviating the internal stress by the bonding layer was decreased and the bonding layer was damaged during loading of the thermal cycle. On the other hand, Comparative Example 9 in which the thickness of the bonding layer was larger than the range of the present invention also had a large thermal resistance change rate and breaking occurred in the insulating substrate after the thermal cycle. This is presumed to be because the mechanical strength of the bonding layer was decreased and the bonding layer was damaged during loading of the thermal cycle.

In addition, in Comparative Example 10 using copper particles instead of silver particles, it was not possible to provide a bonding layer at a heating temperature of 350° C. On the other hand, in Comparative Example 11 in which SAC solder particles were used instead of silver particles, it was possible to provide a bonding layer; however, the manufactured power module substrate with a heat sink had a large thermal resistance change rate and breaking occurred in the insulating substrate after a thermal cycle. It is presumed that this is because the bonding layer (SAC solder) had low heat resistance and the mechanical strength decreased at high temperatures, as a result, due to the internal stress caused by the difference in linear expansion coefficient between the power module substrate and the heat sink during loading of a thermal cycle, the bonding layer was damaged.

On the other hand, in Examples 1 to 9 in which the relative density and the thickness of the bonding layer were in the range of the present invention, the thermal resistance change rate was small and no breaking occurred in the insulating substrate after the thermal cycle.

From the above, according to the Examples, it was confirmed that it is possible to provide a power module substrate with a heat sink which is able to suppress, over a long period of time, an increase in thermal resistance and the generation of breaking in an insulating substrate due to a thermal cycle load and a method for manufacturing a power module substrate with a heat sink.

Example 10

(1) Manufacturing of Power Module Substrate

A circuit layer and a metal layer were bonded to an insulating substrate to manufacture a power module substrate. The material of the insulating substrate was silicon nitride ($Si_3N_4$). The material of the circuit layer was oxygen-free copper. The material of the metal layer was high-purity copper (6N—Cu) having a purity of 99.9999% by mass or more. The size of the insulating substrate was 40 mm×40 mm, the size of the circuit layer was 37 mm×37 mm, and the size of the metal layer was 37 mm×37 mm.

An active brazing material formed of Ag-27.4% by mass Cu-2.0% by mass Ti was provided between the circuit layer and the insulating substrate and between the insulating substrate and the metal layer. Next, the circuit layer, the insulating substrate, and the metal layer were laminated in this order and the obtained laminate was bonded by heating at 850° C. for 10 minutes in a vacuum of $10^{-3}$ Pa in a state of being pressed in a laminating direction at a pressure of 49 kPa (0.5 kgf/cm$^2$) to manufacture a power module substrate.

(2) Preparation of Paste-Bonding Material Composition

A paste-bonding material composition including 15 parts by mass of ethylene glycol (EG) and 85 parts by mass of silver powder having an average particle size of 0.5 μm was prepared in the same manner as in Example 1.

(3) Manufacturing of Power Module Substrate with Heat Sink

As a heat sink, an aluminum sheet formed of A3003 alloy having a size of 50 mm×60 mm×5 mmt and having a passage for a cooling medium therein was prepared.

First, silver plating was applied to the bonding surface of the metal layer of the power module substrate manufactured in (1) described above and the top plate part of the prepared heat sink to provide a silver plating layer such that the thickness was 0.1 μm to 0.5 μm. Next, the paste-bonding material composition prepared in (2) was coated on the surface of the silver plating layer of the heat sink to provide a paste-bonding material composition layer. The thickness of the paste-bonding material composition layer was set such that the thickness of the bonding layer generated by heating was 50 μm. Next, the silver plating layer of the metal layer of the power module substrate was mounted on the paste-bonding material composition layer of the heat sink, and the power module substrate and the heat sink were laminated. Then, the laminate of the power module substrate and the heat sink was placed into a heater and heated in an air atmosphere at a heating temperature of 200° C. for 60 minutes under bonding conditions in which pressing in the laminating direction is not performed to manufacture a power module substrate with a heat sink.

Examples 11 to 18 and Comparative Examples 12 to 21

A power module substrate with a heat sink was manufactured in the same manner as in Example 10, except that the material of the circuit layer of the power module substrate, the type of the bonding material of the paste-bonding material composition, the blending amount of the solvent and the bonding material, and the type of the heat sink plating layer were changed as shown in Table 3 below and the bonding conditions for bonding the power module substrate and the heat sink and the thickness of the bonding layer were changed as shown in Table 4 below. In Example 11, the plating layer was not provided on the metal layer.

[Evaluation]

Regarding the substrates for a power module with a heat sink manufactured in Examples 10 to 18 and Comparative Examples 12 to 24, the thickness and relative density of the bonding layer and the thermal resistance change rate and the substrate breaking of the substrates for a power module with a heat sink after the thermal cycle test were measured in the same manner as in Example 1. The results are shown in Table 4.

In addition, for the substrates for a power module with a heat sink manufactured in Examples 10 to 18, the structure of the bonding layer was observed in the same manner as in Example 1.

Figure 4:
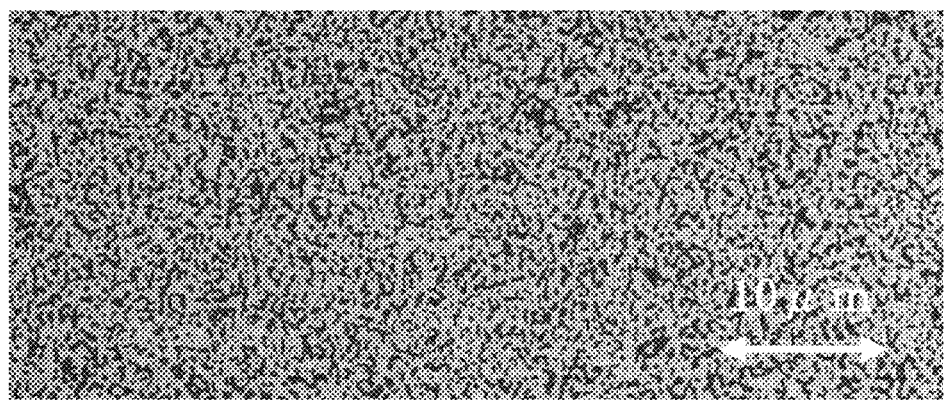
FIG. 4 is a cross-sectional SEM photograph of a bonding layer of a power module substrate with a heat sink manufactured in Example 17 of the present invention.

FIG. 4 shows an SEM photograph of a cross-section of the bonding layer of the power module substrate with a heat sink manufactured in Example 17. From the SEM photograph of FIG. 4, it was confirmed that the bonding layer was a sintered body of silver particles and a porous body having many pores. Similarly, for the substrates for a power module with a heat sink manufactured in Examples 10 to 16 and 18, it was confirmed that the bonding layer was also a sintered body of silver particles and a porous body having many pores.

TABLE 3

| | Power module substrate | | | | Paste-bonding material composition | | | | | Heat sink | |
| --- | --- | --- | --- | --- | --- | --- | --- | --- | --- | --- | --- |
| | | | | | Solvent | | Bonding material | | | | |
| | Insulating substrate Material | Circuit layer Material | Metal layer | | Type | Blending amount (parts by mass) | Material | Average particle size (μm) | Blending amount (parts by mass) | Material | Plating layer |
| | | | Material | Plating layer | | | | | | | |
| Example 10 | Silicon nitride | Oxygen-free copper | High-purity copper | Silver plating | EG | 15 | Silver | 0.5 | 85 | A3003 | Silver plating |
| Example 11 | Silicon nitride | Oxygen-free copper | High-purity copper | — | EG | 15 | Silver | 0.5 | 85 | A3003 | Gold plating |
| Example 12 | Silicon nitride | Oxygen-free copper | High-purity copper | Silver plating | EG | 15 | Silver | 0.5 | 85 | A3003 | Silver plating |
| Example 13 | Silicon nitride | Oxygen-free copper | High-purity copper | Silver plating | EG | 15 | Silver | 0.5 | 85 | A3003 | Silver plating |
| Example 14 | Silicon nitride | Oxygen-free copper | High-purity copper | Silver plating | EG | 15 | Silver | 0.5 | 85 | A3003 | Silver plating |
| Example 15 | Silicon nitride | Oxygen-free copper | High-purity copper | Silver plating | EG | 15 | Silver | 0.2 | 85 | A3003 | Silver plating |
| Example 16 | Silicon nitride | Oxygen-free copper | High-purity copper | Silver plating | EG | 15 | Silver | 1.0 | 85 | A3003 | Silver plating |
| Example 17 | Silicon nitride | 6N—Cu | High-purity copper | Silver plating | EG | 30 | Silver | 0.5 | 70 | A3003 | Silver plating |
| Example 18 | Silicon nitride | 4N—Al | High-purity copper | Silver plating | EG | 10 | Silver | 0.5 | 90 | A3003 | Silver plating |
| Comparative Example 12 | Silicon nitride | Oxygen-free copper | High-purity copper | Silver plating | EG | 15 | Silver | 0.1 | 85 | A3003 | Silver plating |
| Comparative Example 13 | Silicon nitride | Oxygen-free copper | High-purity copper | Silver plating | EG | 15 | Silver | 2.0 | 85 | A3003 | Silver plating |
| Comparative Example 14 | Silicon nitride | Oxygen-free copper | High-purity copper | Silver plating | EG | 40 | Silver | 0.5 | 60 | A3003 | Silver plating |
| Comparative Example 15 | Silicon nitride | Oxygen-free copper | High-purity copper | Silver plating | EG | 15 | Silver | 0.5 | 85 | A3003 | Silver plating |
| Comparative Example 16 | Silicon nitride | Oxygen-free copper | High-purity copper | Silver plating | EG | 15 | Silver | 0.5 | 85 | A3003 | Silver plating |
| Comparative Example 17 | Silicon nitride | Oxygen-free copper | High-purity copper | Silver plating | EG | 15 | Silver | 0.5 | 85 | A3003 | Silver plating |
| Comparative Example 18 | Silicon nitride | Oxygen-free copper | High-purity copper | Silver plating | EG | 15 | Silver | 0.5 | 85 | A3003 | Silver plating |
| Comparative Example 19 | Silicon nitride | Oxygen-free copper | High-purity copper | Silver plating | EG | 15 | SAC solder | 0.5 | 85 | A3003 | Silver plating |
| Comparative Example 20 | Silicon nitride | Oxygen-free copper | High-purity copper | Silver plating | EG | 15 | Silver | 0.5 | 85 | A3003 | Silver plating |
| Comparative Example 21 | Silicon nitride | Oxygen-free copper | High-purity copper | Silver plating | EG | 15 | Silver | 0.5 | 85 | A3003 | Silver plating |

TABLE 4

| | Bonding conditions | | Bonding layer | | Evaluation results | |
| --- | --- | --- | --- | --- | --- | --- |
| | Heating temperature (° C.) | Pressure (MPa) | Thickness (μm) | Relative density (%) | Thermal resistance change rate | Breaking in substrate after thermal cycle |
| Example 10 | 200 | No pressure | 50 | 68 | A | Absent |
| Example 11 | 150 | No pressure | 100 | 62 | A | Absent |
| Example 12 | 300 | 1 | 100 | 88 | A | Absent |
| Example 13 | 250 | No pressure | 10 | 70 | A | Absent |
| Example 14 | 200 | No pressure | 500 | 68 | A | Absent |
| Example 15 | 250 | No pressure | 100 | 90 | A | Absent |
| Example 16 | 250 | No pressure | 100 | 70 | A | Absent |
| Example 17 | 250 | No pressure | 100 | 75 | A | Absent |
| Example 18 | 250 | No pressure | 100 | 80 | A | Absent |
| Comparative Example 12 | 250 | No pressure | 100 | 95 | B | Present |
| Comparative Example 13 | 150 | No pressure | 100 | 50 | B | Present |
| Comparative Example 14 | 250 | No pressure | 100 | 50 | B | Present |
| Comparative Example 15 | 350 | No pressure | 100 | 95 | B | Present |

TABLE 4-continued

|  | Bonding conditions | | Bonding layer | | Evaluation results | |
| --- | --- | --- | --- | --- | --- | --- |
|  | Heating temperature (° C.) | Pressure (MPa) | Thickness (μm) | Relative density (%) | Thermal resistance change rate | Breaking in substrate after thermal cycle |
| Comparative Example 16 | 300 | 3 | 100 | 95 | B | Present |
| Comparative Example 17 | 250 | No pressure | 5 | 75 | B | Present |
| Comparative Example 18 | 250 | No pressure | 700 | 75 | B | Present |
| Comparative Example 19 | 250 | No pressure | 100 | 85 | B | Present |
| Comparative Example 20 | 140 | No pressure | 100 | 58 | B | Absent |
| Comparative Example 21 | 320 | 1 | 100 | 92 | A | Present |

In the power module substrate with a heat sink of Comparative Example 12 manufactured using the paste-bonding material composition in which the average particle size of the silver particles was smaller than the range of the present invention, the relative density of the bonding layer was higher than the range of the present invention. This is presumed to be due to the fact that the silver particles were fine such that the sintering of the silver particles proceeded easily. On the other hand, in the power module substrate with a heat sink of Comparative Example 13 manufactured using a paste-bonding material composition in which the average particle size of the silver particles was larger than the range of the present invention, the relative density of the bonding layer was lower than the range of the present invention. This is presumably because the gap between the silver particles was larger.

In the power module substrate with a heat sink of Comparative Example 14 manufactured using a paste-bonding material composition in which the content of silver particles was smaller than the range of the present invention, the relative density of the bonding layer was lower than the range of the present invention. This is presumed to be because the amount of the solvent was relatively large such that gaps were easily provided between the silver particles.

In the power module substrate with a heat sink of Comparative Example 15 manufactured under bonding conditions in which the heating temperature of the laminate was higher than the range of the present invention, the relative density of the bonding layer was higher than the range of the present invention. This is presumed to be due to the sintering of the silver particles proceeding excessively. Furthermore, in the power module substrate with a heat sink of Comparative Example 16 manufactured under bonding conditions of applying a pressure larger than the range of the present invention in the laminating direction, the relative density of the bonding layer was higher than the range of the present invention. This is presumed to be because sintering proceeded in a state where the silver particles were in strong contact with each other.

On the other hand, in the obtained substrates for a power module with a heat sink in Examples 10 to 18, in which the average particle size and the content of the silver particles of the paste-bonding material composition were in the range of the present invention and the heating temperature of the laminate and the pressure applied in the laminating direction were in the range of the present invention, the relative density of the bonding layer was in the range of the present invention.

In Comparative Examples 12, 15, and 16 in which the relative density of the bonding layer was larger than the range of the present invention, the thermal resistance change rate was large and breaking occurred in the insulating substrate after the thermal cycle. This is presumed to be due to the fact that the elastic modulus of the bonding layer was almost the same as that of bulk silver, the function of alleviating the internal stress by the bonding layer was decreased, and the bonding layer was damaged during loading of a thermal cycle. On the other hand, Comparative Examples 13 and 14, in which the relative density of the bonding layer was lower than the range of the present invention, also had a large thermal resistance change rate and breaking occurred in the insulating substrate after the thermal cycle. This is presumed to be due to the fact that the mechanical strength of the bonding layer was decreased and the bonding layer was damaged during loading of a thermal cycle.

In addition, Comparative Example 17, in which the thickness of the bonding layer was smaller than the range of the present invention, had a large thermal resistance change rate and breaking occurred in the insulating substrate after the thermal cycle. This is presumed to be due to the fact that the function of alleviating the internal stress by the bonding layer was decreased and the bonding layer was damaged during loading of the thermal cycle. On the other hand, Comparative Example 18, in which the thickness of the bonding layer was larger than the range of the present invention, also had a large thermal resistance change rate and breaking occurred in the insulating substrate after the thermal cycle. This is presumed to be due to the fact that the mechanical strength of the bonding layer was decreased and the bonding layer was damaged during loading of the thermal cycle.

In Comparative Example 19 using SAC solder particles instead of silver particles, the manufactured power module substrate with a heat sink had a large thermal resistance change rate and breaking occurred in the insulating substrate after the thermal cycle. This is presumed to be due to the fact that the bonding layer (SAC solder) had low heat resistance and the mechanical strength decreased at high temperatures, as a result, the bonding layer was damaged due to the internal stress caused by the difference in linear expansion coefficient between the power module substrate and the heat sink during loading of a thermal cycle.

In addition, in Comparative Example 20, in which the heating temperature was 140° C., no breaking occurred in the insulating substrate after the thermal cycle, but the thermal resistance change rate was large. It is presumed that this is because the relative density of the bonding layer was slightly low at 58%, and the mechanical strength of the bonding layer was slightly low, thus, partial breaking were generated in the bonding layer and the bonding layer as a whole was not damaged during loading of a thermal cycle; however, the thermal resistance of the bonding layer was increased. On the other hand, in Comparative Example 21 in which the heating temperature was 320° C., the thermal resistance change rate was small, but breaking occurred in the insulating substrate after the thermal cycle. It is presumed that this is because the relative density of the bonding layer was slightly higher at 92% and the function of alleviating the internal stress by the bonding layer was slightly reduced, thus, no breaking or damage occurred in the bonding layer; however, the effect of alleviating the internal stress caused by the difference in linear expansion coefficient between the substrate for a lower module and the heat sink was decreased and the substrate was broken.

On the other hand, in Examples 10 to 18 in which the relative density and thickness of the bonding layer were in the range of the present invention, the thermal resistance change rate was small and no breaking occurred in the insulating substrate after the thermal cycle.

From the above, according to the Examples, it was confirmed that it is possible to provide a power module substrate with a heat sink which is able to suppress, over a long period of time, an increase in thermal resistance and breaking in an insulating substrate due to a thermal cycle load and a method for manufacturing a power module substrate with a heat sink.

INDUSTRIAL APPLICABILITY

According to the present invention, it is possible to provide a power module substrate with a heat sink which is able to suppress, over a long period of time, an increase in thermal resistance and breaking in an insulating substrate due to a thermal cycle load and a method for manufacturing a power module substrate with a heat sink.

REFERENCE SIGNS LIST

1: Power module
2: Solder layer
3: Semiconductor element
10: Power module substrate with heat sink
20: Power module substrate
21: Insulating substrate
22: Circuit layer
22A: Mounting surface
23: Metal layer
23A: Bonding surface
30: Bonding layer
40: Heat sink
41: Top plate part
42: Passage

The invention claimed is:

1. A power module substrate with a heat sink comprising:
a power module substrate provided with an insulating substrate, a circuit layer
provided on one surface of the insulating substrate, and a metal layer provided on the other surface of the insulating substrate; and
a heat sink bonded via a bonding layer to a surface of the metal layer of the power module substrate on an opposite side to the insulating substrate,
wherein the bonding layer is a sintered body of silver particles and a porous body having a relative density in a range of 60% or more and 80% or less and has a thickness in a range of 10 µm or more and 500 µm or less.

2. The power module substrate with a heat sink according to claim 1,
wherein the metal layer is formed of an aluminum sheet formed of aluminum or an aluminum alloy, or a copper sheet formed of copper or a copper alloy.

3. The power module substrate with a heat sink according to claim 2,
wherein the metal layer is formed of the aluminum sheet, and a silver plating layer or a gold plating layer is provided on a surface of the aluminum sheet on an opposite side to the insulating substrate.

4. A method for manufacturing the power module substrate with a heat sink according to claim 1, the method comprising:
a process of forming paste-bonding material composition layer of providing a layer of a paste-bonding material composition including silver particles having an average particle size in a range of 0.1 µm or more and 1 µm or less in an amount in a range of 70% by mass or more and 95% by mass or less on at least one surface of a surface of a metal layer of a power module substrate on an opposite side to an insulating substrate and a heat sink, the power module substrate being provided with the insulating substrate, a circuit layer provided on one surface of the insulating substrate, and the metal layer provided on the other surface of the insulating substrate;
a laminating process of laminating the power module substrate and the heat sink via the layer of the paste-bonding material composition; and
a heating process of heating the laminated power module substrate and the heat sink at a temperature of 150° C. or higher and 300° C. or lower without pressing in a laminating direction.

* * * * *